US011043362B2

(12) United States Patent
Ventzek et al.

(10) Patent No.: US 11,043,362 B2
(45) Date of Patent: Jun. 22, 2021

(54) PLASMA PROCESSING APPARATUSES INCLUDING MULTIPLE ELECTRON SOURCES

(71) Applicant: Tokyo Electron Limited, Tokyo (JP)

(72) Inventors: Peter Ventzek, Austin, TX (US); Barton Lane, Austin, TX (US); Zhiying Chen, Austin, TX (US); Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/572,696

(22) Filed: Sep. 17, 2019

(65) Prior Publication Data
US 2021/0082668 A1    Mar. 18, 2021

(51) Int. Cl.
*H01J 37/32*   (2006.01)
*H01J 37/06*   (2006.01)

(52) U.S. Cl.
CPC ........ *H01J 37/32174* (2013.01); *H01J 37/06* (2013.01); *H01J 37/32715* (2013.01); *H01J 37/3244* (2013.01); *H01J 2237/327* (2013.01)

(58) Field of Classification Search
CPC .. H01J 37/321; H01J 37/3244; H01J 37/3211; H01J 37/32082; H01J 37/08; H01J 37/32458; H01J 37/32706; H01J 37/3222; H01J 37/32422; H01J 37/32871; H01J 37/3233; H01J 37/32412; H01J 37/32596; H01J 2237/0815; H01J 2237/083; H01J 2237/31701; H01J 2237/3365; H01J 27/16; H01J 37/16; H01J 37/3171; H01L 21/3065; H01L 21/2855; H01L 21/76862; H05H 1/46; H05H 2001/4652; H05H 2001/4682; H05H 2001/463; C23C 16/45536;
(Continued)

(56) References Cited

U.S. PATENT DOCUMENTS

| 5,906,757 A | 5/1999 | Kong et al. |
| 6,251,792 B1 * | 6/2001 | Collins ................. C23C 16/507 257/E21.252 |

(Continued)

FOREIGN PATENT DOCUMENTS

| JP | 2008262781 | 10/2008 |
| KR | 10-2002-0005991 A | 1/2002 |
| WO | WO 2013-028313 A1 | 2/2013 |

OTHER PUBLICATIONS

International Search Report and Written Opinion of the International Searching Authority dated Feb. 1, 2019 in PCT/US2018/053373, 9 pages.

(Continued)

*Primary Examiner* — David A Vanore
(74) *Attorney, Agent, or Firm* — Oblon, McClelland, Maier & Neustadt, L.L.P.

(57) ABSTRACT

A plasma processing apparatus includes a processing chamber, a substrate disposed in the processing chamber, and a plurality of electron sources configured to supply electrons to a plasma generated in the processing chamber. Each of the plurality of electron sources includes a first side facing the plasma in the processing chamber. Each of the plurality of electron sources also includes a resonant structure disposed at the first side and configured to be held at a negative direct current bias voltage.

19 Claims, 7 Drawing Sheets

(58) Field of Classification Search
CPC ....... C23C 16/509; C23C 14/26; C23C 14/30; C23C 14/48; C23C 16/45563; C23C 16/50; C23C 16/503; C23C 16/5093
USPC ..... 250/423 R, 423 F, 424, 425; 315/111.21, 315/111.81; 427/569, 523; 438/720, 438/710, 798, 695, 707, 712; 156/345, 156/348, 345.35, 345.41; 257/E21.252, 257/E21.328, E21.168, E21.218
See application file for complete search history.

(56) References Cited

U.S. PATENT DOCUMENTS

| | | | |
|---|---|---|---|
| 6,518,195 B1* | 2/2003 | Collins | C23C 16/507 257/E21.252 |
| 6,767,838 B1* | 7/2004 | Ono | C23F 4/00 438/720 |
| 7,221,553 B2* | 5/2007 | Nguyen | H01L 21/67109 361/233 |
| 7,645,357 B2* | 1/2010 | Paterson | H01J 37/32091 156/345.51 |
| 7,767,977 B1 | 8/2010 | Godet et al. | |
| 8,279,577 B2* | 10/2012 | Nguyen | H01J 37/32871 361/234 |
| 8,932,959 B2* | 1/2015 | Nemani | H01J 37/321 438/706 |
| 9,099,503 B2 | 8/2015 | Iwata | |
| 9,293,299 B2 | 3/2016 | Yamazawa | |
| 9,368,328 B2 | 6/2016 | Ozimek et al. | |
| 9,881,722 B2 | 1/2018 | Marakhtanov et al. | |
| 10,020,167 B2 | 7/2018 | Yamazawa | |
| 2004/0104683 A1* | 6/2004 | Leung | H05H 1/46 315/111.81 |
| 2004/0211661 A1* | 10/2004 | Zhang | H01L 21/76862 204/192.12 |
| 2005/0061251 A1* | 3/2005 | Wei | C23C 14/48 118/726 |
| 2006/0137608 A1 | 6/2006 | Choi et al. | |
| 2009/0101283 A1 | 4/2009 | Iwata | |
| 2010/0012029 A1* | 1/2010 | Forster | H01J 37/32165 118/708 |
| 2010/0018293 A1* | 1/2010 | Monkowski | G01M 3/38 73/40.7 |
| 2012/0247679 A1* | 10/2012 | Yamazawa | H01J 37/3244 156/345.48 |
| 2012/0258555 A1* | 10/2012 | Holland | H01J 37/32596 438/5 |
| 2012/0258606 A1* | 10/2012 | Holland | H01J 37/32596 438/798 |
| 2012/0258607 A1* | 10/2012 | Holland | H01J 37/32357 438/798 |
| 2013/0098551 A1 | 4/2013 | Dorf et al. | |
| 2013/0224961 A1* | 8/2013 | Zhao | H01J 37/32256 438/726 |
| 2013/0260567 A1* | 10/2013 | Marakhtanov | H01J 37/32091 438/710 |
| 2014/0231016 A1* | 8/2014 | Yoshikawa | H01J 37/32192 156/345.41 |
| 2015/0041432 A1* | 2/2015 | Chen | H01J 37/32082 216/66 |
| 2015/0206711 A1* | 7/2015 | Ozimek | H01J 37/321 315/111.51 |
| 2016/0042920 A1* | 2/2016 | Cho | H01J 37/3255 315/111.21 |
| 2016/0097119 A1* | 4/2016 | Cui | C23C 16/4405 134/1.1 |
| 2016/0118256 A1* | 4/2016 | Rastogi | H01L 21/31138 438/695 |
| 2016/0155613 A1 | 6/2016 | Yamazawa | |
| 2016/0276134 A1* | 9/2016 | Collins | H01J 37/3233 |
| 2016/0293386 A1 | 10/2016 | Chen et al. | |
| 2016/0293432 A1* | 10/2016 | Ranjan | H01L 21/3065 |

OTHER PUBLICATIONS

International Search Report and Written Opinion of the International Searching Authority dated Aug. 21, 2019 in PCT/US2019/030201, 10 pages.

International Search Report and Written Opinion dated Nov. 6, 2020, in PCT/US2020/042885, 14 pages.

* cited by examiner

FIG. 1A
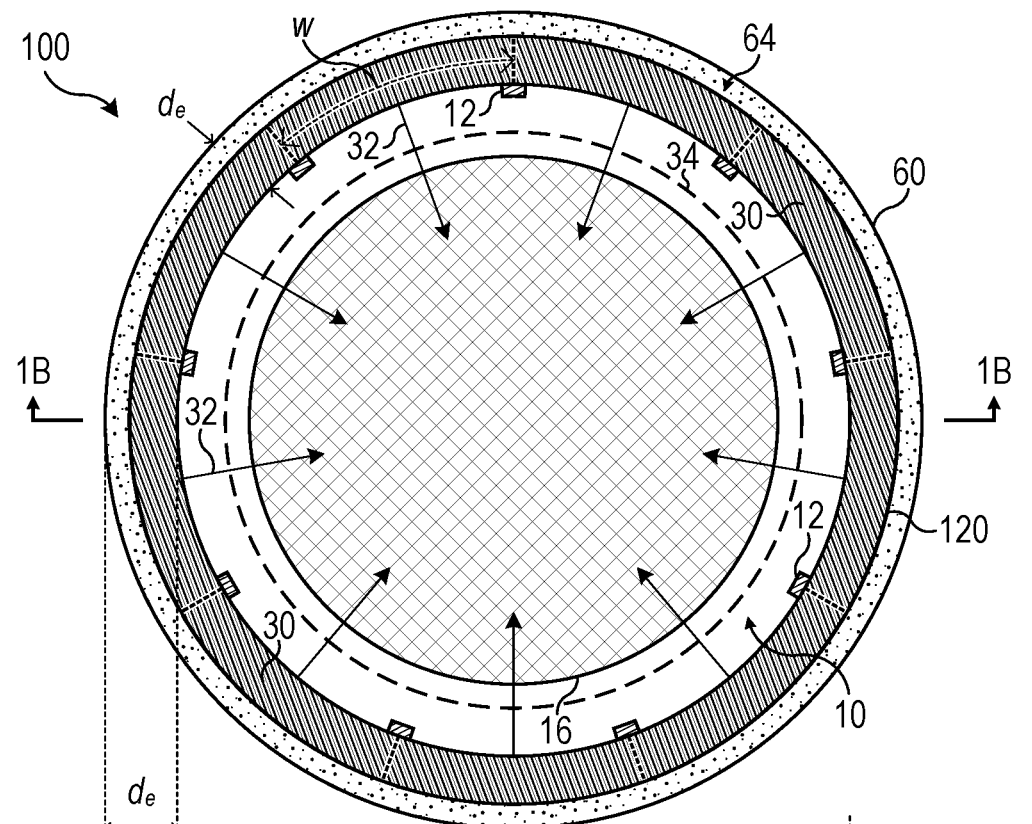
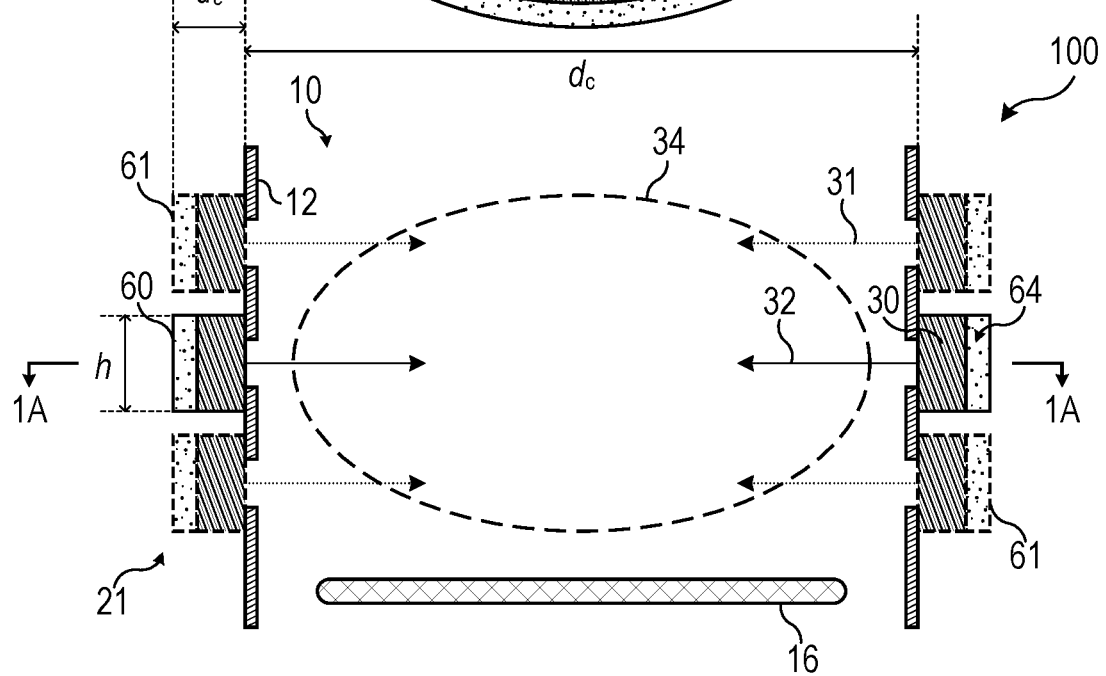
FIG. 1B

FIG. 3A
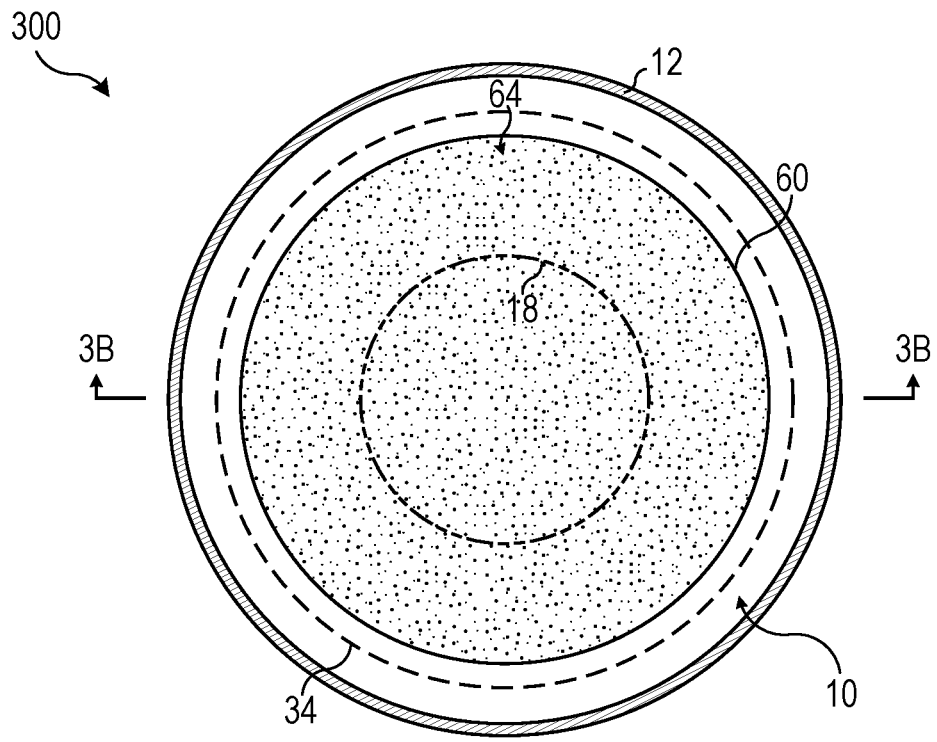
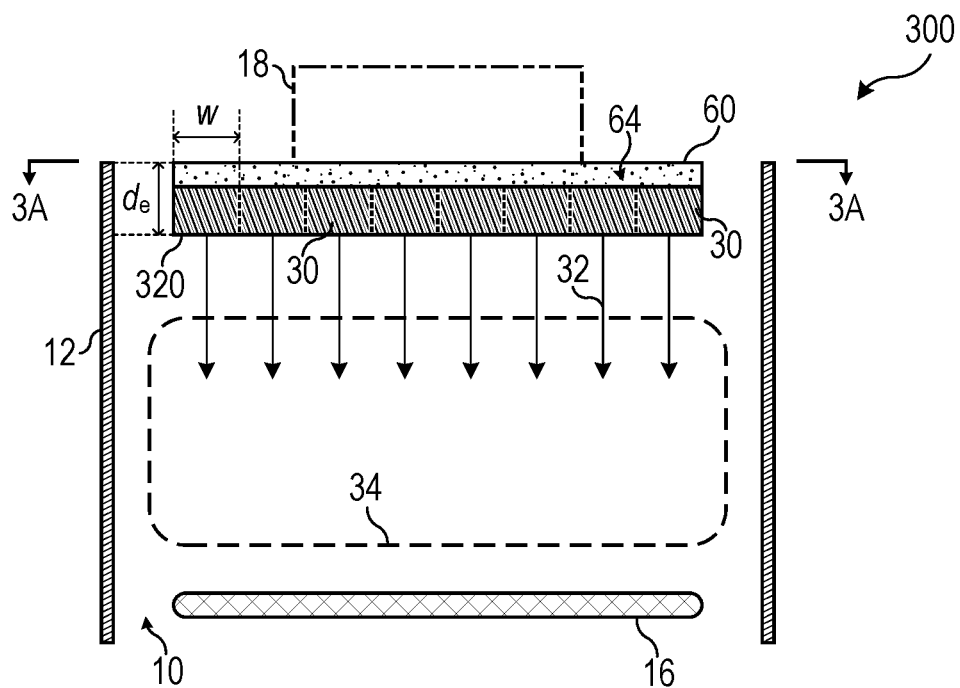
FIG. 3B

PLASMA PROCESSING APPARATUSES INCLUDING MULTIPLE ELECTRON SOURCES

TECHNICAL FIELD

The present invention relates generally to plasma processing apparatuses, and, in particular embodiments, to apparatuses and methods for plasma processing using a plurality of electron sources.

BACKGROUND

Device formation within microelectronic workpieces may involve a series of manufacturing techniques including formation, patterning, and removal of a number of layers of material on a substrate. In order to achieve the physical and electrical specifications of current and next generation semiconductor devices, processing equipment and methods that enable reduction of feature size while maintaining structural integrity are desirable for various patterning processes. As device structures densify and develop vertically, the desire for precision material processing becomes more compelling.

Trade-offs between selectivity, profile control, film conformality, and uniformity in plasma processes can be difficult to manage. Plasma processing techniques that use electron-beam sustained plasmas can provide various advantages for sensitive plasma processes such as high aspect ratio contact (HARC) type etches and patterning applications as well as for atomic level etch (ALE) and atomic level deposition (ALD), for example. However, electron sources that supply electrons such as hollow cathodes or external sources can be prohibitively large and bulky. Therefore, smaller electron sources that can supply electrons for electron-beam sustained plasmas may be desirable.

SUMMARY

In accordance with an embodiment of the invention, a plasma processing apparatus includes a processing chamber, a substrate disposed in the processing chamber, and a plurality of electron sources configured to supply electrons to a plasma generated in the processing chamber. Each of the plurality of electron sources includes a first side facing the plasma in the processing chamber. Each of the plurality of electron sources also includes a resonant structure disposed at the first side and configured to be held at a negative direct current bias voltage.

In accordance with another embodiment, a plasma processing apparatus includes a processing chamber, a substrate disposed in the processing chamber, and an array of resonant antennas attached to the processing chamber. The array of resonant antennas is configured to receive radio frequency power and generate a plurality of electron beams directed toward a plasma in the processing chamber.

In accordance with still another embodiment of the invention, a plasma processing apparatus includes a processing chamber including a chamber wall, a substrate disposed in the processing chamber, a monolithic body of dielectric material attached to the chamber wall, a plurality of electron sources disposed in the monolithic body of dielectric material, and a gas plenum chamber coupled to the plurality of electron sources. The processing chamber includes a maximum width measured parallel to a major surface of the substrate. Each of the plurality of electron sources is configured to supply electrons to a plasma generated in the processing chamber. The gas plenum chamber is configured to supply gas to the plurality of electron sources. The plurality of electron sources together with the gas plenum chamber includes a maximum thickness measured from the chamber wall. A ratio of the maximum width to the maximum thickness is greater than 100.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A and 1B illustrate a schematic diagram of an example plasma processing apparatus including a plurality of electron sources surrounding a processing chamber in accordance with an embodiment of the invention, where FIG. 1A illustrates a plan view of the plasma processing apparatus and FIG. 1B illustrates a cross-sectional view of the plasma processing apparatus;

FIG. 2A illustrates a plan view of the plasma processing apparatus and FIG. 2B illustrates a cross-sectional view of the plasma processing apparatus;

FIGS. 3A and 3B illustrate a schematic diagram of an example plasma processing apparatus including a plurality of electron sources disposed above a substrate in accordance with an embodiment of the invention, where FIG. 3A illustrates a plan view of the plasma processing apparatus and FIG. 3B illustrates a cross-sectional view of the plasma processing apparatus;

Figure 2A:
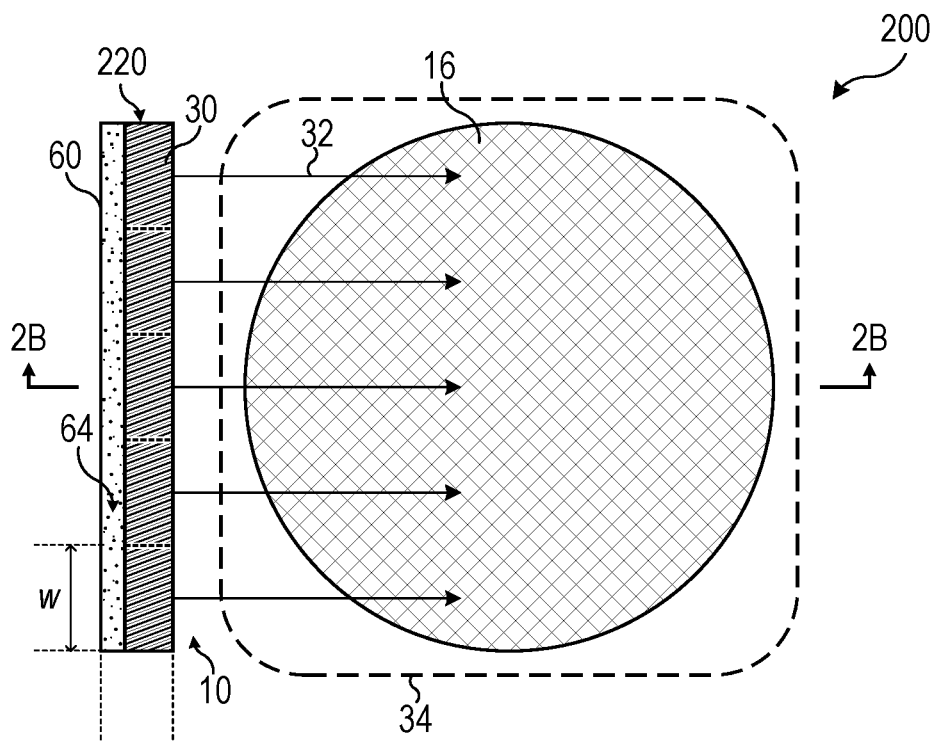
FIGS. 2A and 2B illustrate a schematic diagram of an example plasma processing apparatus including a plurality of electron sources disposed at a chamber wall of a processing chamber in accordance with an embodiment of the invention, where

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Various techniques, as described herein, pertain to device fabrication using precision plasma processing techniques utilizing electron-beam sustained plasma. Such processing techniques may include, for example, etch and/or deposition processes. Several instances manifest in semiconductor manufacturing in both front end of line (FEOL, e.g., transistor fabrication) through to the back end of line (BEOL, e.g., interconnect fabrication), where materials are to be manipulated with a high degree of precision. Electron-beam sustained plasma may be generated at low pressure and have low electron temperature and substantially uniform density which may be well-suited for precision processing.

Conventional plasma processing apparatuses and methods that use electron-beam sustained plasma utilize large electron sources which increase the footprint of the plasma processing apparatus. Such large electron sources include external sources (e.g., an external plasma) and hollow cathodes, for example. The increased size of the conventional plasma processing apparatus disadvantageously limits the applicability of the plasma processing apparatus in existing processing systems. For example, it may be desirable to maximize the size of a processing chamber to allow for simultaneous processing of a larger substrate area. However, large electron sources incorporated in conventional plasma processing apparatuses must be accounted for in the overall size of the plasma processing apparatus. In order for the conventional plasma processing apparatus to be integrated into an existing system (e.g., a cluster tool) the size of the processing chamber may be reduced which negatively impacts throughput and viability.

Alternatively, the number of conventional plasma processing apparatuses in a cluster tool may be reduced, which also negatively impacts throughput. For example, it may be desirable to include as many conventional plasma processing apparatuses as possible in the cluster tool to improve throughput and make efficient use of available space. The design of the cluster tool may also introduce several other considerations (e.g. serviceability and access) that may further limit the practical real-estate available around processing chambers of the conventional plasma processing apparatuses in the cluster tool. Therefore, the large electron sources incorporated in conventional plasma processing apparatuses impose limitations on the number of plasma processing apparatuses that can be included in a given cluster tool.

The embodiments described herein provide apparatuses and methods for plasma processing using a plurality of electron sources to supply electrons to a plasma. The plasma may be an electron-beam sustained plasma. The embodiments include a substrate disposed in a processing chamber. The plurality of electron sources may be configured to receive alternating current (AC) power. For example, the AC power may have a frequency above about 30 MHz. The plurality of electron sources may extend partially or completely around the processing chamber. Alternatively or additionally, the plurality of electron sources may be disposed in an array above the substrate.

Each of the electron sources may include a resonant structure configured to supply electrons to the plasma. A negative direct current (DC) bias voltage may be coupled to each resonant structure. The negative DC bias voltages may accelerate the electrons toward the plasma in the processing chamber. Each of the electron sources may generate one or more electron beams. The electron beams may be directed toward the plasma in the processing chamber. Each of the electron sources may include a dielectric injector. Electrons associated with the respective electron source may pass through the dielectric injector. An ion trap may be included to carry ions away from the processing chamber.

The plurality of electron sources may be disposed in a monolithic body of dielectric material. For example, the dielectric material may be a ceramic material. The monolithic body of dielectric material may be attached to a chamber wall. A gas plenum chamber may be configured to supply gas to the plurality of electron sources. The thickness of the plurality of electron sources together with the gas plenum chamber may be measured from the chamber wall. A ratio of the maximum width of the processing chamber measured parallel to a major surface of the substrate to the maximum thickness of the plurality of electron sources together with the gas plenum chamber may be greater than 100.

The maximum thickness of the plurality of electron sources may be advantageously small. For example, the maximum thickness of the plurality of electron sources may be less than 5 cm. The maximum width of the processing chamber may be designed to accommodate large substrates such as a 200 mm wafer, a 300 mm wafer, or larger. Therefore, the ratio of the maximum width of the processing chamber to the maximum thickness of the electron sources may be advantageously large, for example, greater than 100 (e.g. between 100 and 500 or even higher). In contrast, conventional electron sources may have much larger thickness (e.g., 300-400 cm for external sources and several tens of centimeters for hollow cathodes) resulting in much smaller ratios (e.g., between 1 and 50) which disadvantageously increases the required footprint of a conventional plasma processing apparatus for a given substrate size. Additionally, hollow cathode sources may also disadvantageously pose a contamination risk due to sputtering.

The plurality of electron sources may advantageously provide a spatially uniform supply of electrons to a plasma. Such spatial uniformity in the electron supply may beneficially improve uniformity of the plasma. This may also allow for improved viability of lower frequency plasmas (e.g., plasmas generated using applied power in the very high frequency (VHF) range).

Each of the electron sources may also advantageously be controlled individually. For example, various control parameters of each individual electron source (e.g., voltage, power, frequency, etc.) may be controlled. This may advantageously enable enhances spatial and/or temporal control over plasma properties. For example, a plasma may advantageously kept uniform over a large volume. In contrast, properties of localized regions of the plasma may also be controlled by virtue of individually tuned control parameters on a small length small (e.g., 1 cm spatial resolution corresponding to a pitch of an array of electron sources).

The plurality of electron sources may have the added benefits of flexible, low-cost, and simple fabrication. For example, the plurality of electron sources may advantageously be fabricated using damascene processes. The plurality of electron sources may be formed in a monolithic body of dielectric material. This may advantageously reduce the thickness of the plurality of electron sources. A gas plenum chamber and gas plumbing may also advantageously be included in the monolithic body of dielectric material in some embodiments.

Embodiments provided below described various apparatuses and methods for plasma processing, and in particular, apparatuses and methods for plasma processing that use a plurality of electron sources. The following description describes the embodiments. Several example plasma processing apparatuses are described using FIGS. 1A-1B, 2A-2B, and 3A-3C. An example plurality of electron sources is described using FIG. 4. Two example electron sources along with associated plasmas are described using FIGS. 5 and 6. An example plasma processing system which may include embodiment plasma processing apparatuses is described using FIG. 7. An example method of operating a plasma processing apparatus is described using FIG. 8.

FIGS. 1A and 1B illustrate a schematic diagram of an example plasma processing apparatus including a plurality of electron sources surrounding a processing chamber in accordance with an embodiment of the invention, where FIG. 1A illustrates a plan view of the plasma processing apparatus and FIG. 1B illustrates a cross-sectional view of the plasma processing apparatus.

Referring to FIGS. 1A and 1B, a plasma processing apparatus 100 includes a processing chamber 10. A substrate 16 is disposed in the processing chamber 10. The processing chamber 10 includes a chamber wall 12 substantially perpendicular to a major surface of the substrate 16. A plurality of electron sources 120 is arranged such that electrons from each electron source 30 of the plurality of electron sources 20 are supplied to a plasma 34 generated in the processing chamber 10. For example, electrons from each electron source 30 may be supplied to the plasma 34 by an associated electron beam 32. A gas plenum chamber 60 may be included to confine a gas plenum 64. The gas plenum 64 may be configured to supply a gas to the plurality of electron sources 20. Optional pluralities of electron sources 21 may also be included.

The processing chamber 10 may be a vacuum chamber configured to hold a vacuum suitable for plasma processing, such as a high vacuum (1 mTorr-1 μTorr), an ultra-high vacuum (1 μTorr-1 nTorr), etc. During plasma processing, the pressure in the processing chamber 10 may be higher, (e.g. up to 100 mTorr during etching processes). In one embodiment, the processing chamber 10 is cylindrical with a circular cross-section as shown. In other embodiments, the processing chamber 10 may be any suitable shape.

The processing chamber 10 including the chamber wall 12 may comprise a conductive material such as metal, for example. In one embodiment, the chamber wall 12 comprises aluminum. In one embodiment, the chamber wall 12 comprises stainless steel. Interior and/or exterior surfaces of the chamber wall 12 may be coated with a protective material, such as alumina, yttria, and the like. Openings may be included in the chamber wall 12 to allow electrons from the plurality of electron sources 120 to enter the processing chamber 10. Alternatively or additionally, pluralities of electron sources may be included inside the chamber wall 12 which may remove the need for openings.

The substrate 16 may be any suitable substrate, such as a semiconductor substrate, dielectric substrate, or metal substrate, for example. In some embodiments, the substrate 16 is a wafer substrate. The processing chamber 10 has a maximum width $d_c$ large enough to accommodate the substrate 16. In some embodiments, the substrate 16 has a diameter greater than or equal to 150 mm. For example, the diameter of the substrate 16 may be 150 mm, 200 mm, 300 mm, 450 mm, or even larger. Accordingly, the maximum width $d_c$ of the processing chamber 10 may be greater than 150 mm. In various embodiments, the maximum width $d_c$ of the processing chamber 10 is greater than 200 mm, and is greater than 300 mm in some embodiments. In one embodiment, the maximum width $d_c$ of the processing chamber 10 is greater than 450 mm.

The plurality of electron sources 120 may be configured in any suitable spatial arrangement. In one embodiment, the plurality of electron sources 120 is a ring of electron sources as illustrated. For example, the ring of electron sources may be a continuous structure with multiple electron sources embedded within. The plurality of electron sources 120 extends completely around the processing chamber 10 in one embodiment. However, in some embodiments, the plurality of electron sources 120 extends only partially around the processing chamber 10. Additionally or alternatively, electron sources may also be included above the substrate 16 inside or outside of the processing chamber 10.

The plurality of electron sources 120 may be an array of electron sources. For example, the plurality of electron sources 120 may be a linear array as illustrated. Alternatively, the plurality of electron sources 120 may be a two-dimensional array disposed in a plane, on a curved surface, or irregularly arranged in any suitable configuration. Such arrays of electron sources may be uniformly distributed or irregularly distributed. For example, the plurality of electron sources 120 is a plane array of electron sources in some embodiments, and is a rectangular array disposed in the plane in one embodiment, or is a polar array in another embodiment. Other configurations are also possible such as spirals, triangular grids, hexagonal grids, and others.

Each electron source 30 may include a resonant structure configured to generate electrons. For example, each resonant structure may be a resonant antenna configured to generate a corresponding electron source plasma. The resonant structures may be biased so as to accelerate electrons as a corresponding electron beam 32 towards the plasma 34 in the processing chamber 10. Each electron source 30 includes a width w which is a maximum dimension of the electron source measured in a direction perpendicular to the associated electron beam 32. It should be noted that the width w may be influenced by the length of a resonant structure of the electron source. Therefore, the width w may be appropriately measured along a curved path corresponding with a curved surface to which the plurality of electron sources 120 is attached, as illustrated. Further, although nine electron sources are shown in the plurality of electron sources 120 for purposes of clarity, the actual number of electron sources may be greater than or less than nine and may depend (at least in part) on the perimeter of the processing chamber 10 as well as the configuration of the plurality of electron sources 120.

The plurality of electron sources 120 is configured to receive AC power. In various embodiments, the AC power comprises radio frequency (RF) power. The RF power may be in the microwave frequency range (e.g., 3-300 GHz). Alternatively, the RF power may be in the VHF range (e.g., 30-300 MHz), the ultra-high frequency (UHF) range (e.g., 300 MHz-3 GHz), as well as other ranges. The width w may be different according to the frequency of the AC power applied to the plurality of electron sources 120. In some embodiments, the width w is between about 1 mm and about 2 cm, and is about 1 cm in one embodiment. For example, a width w of about 1 cm may be practically implemented when supplying microwave power to a plurality of electron sources. In other embodiments, the width w is between about 5 cm and about 20 cm, and is about 10 cm in one embodiment. For example, a width w of about 10 cm may be practically implemented when supplying VHF power to a plurality of electron sources.

Each electron source 30 also includes a height h as shown, which may have values in ranges similar to those described above with respect to the width w. The height h of each of the electron sources 30 may or may change with different power frequency (i.e., one or more of the dimensions of a given electron source may be adjusted in accordance with the frequency of provided power). In some cases, there may be a tradeoff between the width w and the height h such that a decrease in one results in an increase of the other. Appropriate values for the width w and the height h may be chosen according to the desired properties of a specific application.

The plasma 34 is an electron-beam sustained plasma in one embodiment. The electron-beam sustained plasma may be ignited by electrons generated by the plurality of electron sources 120. In one embodiment, the electron-beam sustained plasma is sustained by electrons generated by the plurality of electron sources 120. Alternatively, the plasma 34 may be self-sustaining after ignition. The plasma 34 may advantageously be generated at low pressure enabled by the electrons supplied by the plurality of electron sources 120. The plasma 34 may have characteristics beneficial for precision plasma processing such low electron temperature and/or a high degree of uniformity because of the electrons supplied by the plurality of electron sources 120.

The gas plenum chamber 60 may be integrated with the plurality of electron sources 120 or may a separate structure. For example, the plurality of electron sources 120 and the gas plenum chamber 60 are formed from a monolithic body of dielectric material in one embodiment. The gas supplied by the gas plenum 64 may be the same as or different from a source gas supplied to the processing chamber 10 from which the plasma 34 is generated.

The plurality of electron sources 120 together with the gas plenum chamber 60 have a maximum thickness $d_e$ which may be measured from a surface of the chamber wall 12. In some embodiments, the gas plenum chamber 60 may be implemented above the plurality of electron sources 120 and therefore would not contribute to the maximum thickness $d_e$. The maximum thickness $d_e$ is thin in comparison to conventional electron sources and may advantageously reduce the overall footprint of the plasma processing apparatus 100 when compared to conventional plasma processing apparatuses. In various embodiments, the maximum thickness $d_e$ is between about 0.5 cm and about 3 cm. In one embodiment, the maximum thickness $d_e$ is about 1 cm. In another embodiment, the maximum thickness $d_e$ is about 2 cm.

By virtue of the small dimensionality of the maximum thickness $d_e$, the ratio of the maximum width $d_c$ of the processing chamber 10 to the maximum thickness $d_e$ is advantageously large compared to conventional plasma processing apparatuses. In various embodiments, the ratio $d_c:d_e$ is greater than 100. In some embodiments, the ratio $d_c:d_e$ is greater than 250. In one embodiment, the ratio $d_c:d_e$ is about 300. However, the ratio $d_c:d_e$ may be 500 or even higher in some cases.

The optional pluralities of electron sources 21 may also be included. For example, as shown, additional rings of electron sources may optionally be included above and/or below the plurality of electron sources 120. Of course, all rows of electron sources could also be integrated into a single structure rather than being separate. Furthermore, other configurations are also possible and contemplated such as a helical structure, a semicircle, etc.

Subsets of electron sources of the plurality of electron sources 120 may be individually addressable. For example, attributes of each of the electron sources 30 may be individually controlled. Spatial characteristics of the plasma 34 may be advantageously influenced in this way. Attributes such as voltage, power, and frequency may be individually controlled for each of the electron sources 30. Controlling voltage and power to a given electron sources may directly control the quantity of electrons generated at the electron source. For cases in which each of the electron sources 30 includes a resonant structure, changing the frequency of the applied power may influence the energy coupled to a corresponding electron source plasma which in turn may affect the quantity of generated electrons. In some cases, the granularity of control may not be individual. Instead, attributes of pairs or groups of electron sources may be controlled individually.

Figure 2B:
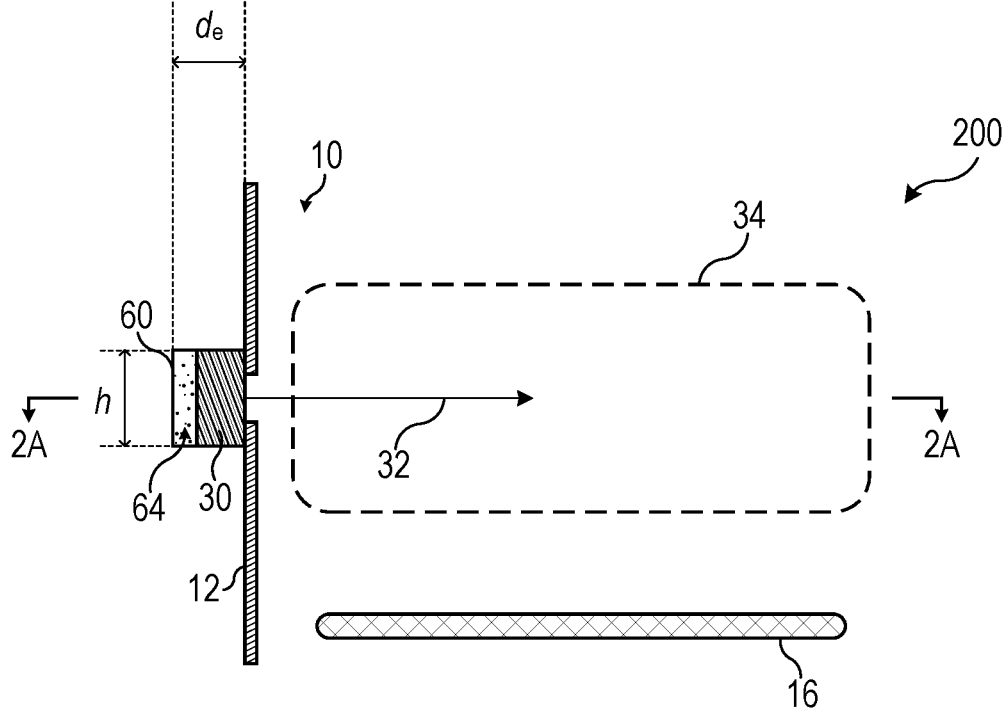

FIGS. 2A and 2B illustrate a schematic diagram of an example plasma processing apparatus including a plurality of electron sources disposed at a chamber wall of a processing chamber in accordance with an embodiment of the invention, where FIG. 2A illustrates a plan view of the plasma processing apparatus and FIG. 2B illustrates a cross-sectional view of the plasma processing apparatus. The plasma processing apparatus of FIGS. 2A and 2B may be an alternative configuration (e.g., share features that may be in an different arrangement) of other plasma processing apparatuses described herein, such as the plasma processing apparatus 100 of FIG. 1, for example. Similarly labeled elements may be as previously described.

Referring to FIGS. 2A and 2B, a plasma processing apparatus 200 includes a substrate 16 disposed in a processing chamber 10 including chamber walls 12. A plurality of electron sources 220 is configured to supply electrons from each electron source 30 to a plasma 34. A gas plenum chamber 60 including a gas plenum 64 may be configured to supply a gas to the plurality of electron sources 220. The plurality of electron sources 220 may be arranged such that electron beams 32 are directed in a plane parallel to a major surface of the substrate 16. For example, the electron beams 32 may be generated on one side of the processing chamber 10 as shown. The shape of the plasma 34 may be influenced by the configuration of the plurality electron sources 220, as qualitatively illustrated. However, other factors may also impact the size and shape of the plasma 34 such as individual control of each electron source 30.

The plurality of electron sources 220 may also be extended around additional sides of the processing chamber 10 and/or additional pluralities of electron sources may also be included. Additionally or alternatively, the plurality of electron sources 220 may follow a curved surface of the processing chamber 10. In this way, the plurality of electron sources 120 of FIGS. 1A and 1B could be considered a specific implementation of the plurality of electron sources 220 in which the plurality of electron sources extend completely around a substantially cylindrical processing chamber.

FIGS. 3A and 3B illustrate a schematic diagram of an example plasma processing apparatus including a plurality of electron sources disposed above a substrate in accordance with an embodiment of the invention, where FIG. 3A illustrates a plan view of the plasma processing apparatus and FIG. 3B illustrates a cross-sectional view of the plasma processing apparatus. The plasma processing apparatus of FIGS. 3A and 3B may be an alternative configuration (e.g., share features that may be in an different arrangement) of other plasma processing apparatuses described herein, such as the plasma processing apparatus 100 of FIG. 1, for example. Similarly labeled elements may be as previously described.

Referring to FIGS. 3A and 3B, a plasma processing apparatus 300 includes a substrate 16 disposed in a processing chamber 10 including chamber walls 12. A plurality of electron sources 320 is configured to supply electrons from each electron source 30 to a plasma 34 from above the substrate 16. A gas plenum chamber 60 including a gas plenum 64 may be configured to supply a gas to the plurality of electron sources 320. The plurality of electron sources 320 may be arranged such that electron beams 32 are directed in a plane perpendicular to a major surface of the substrate 16. As shown, the plurality of electron sources 320 may be a two-dimensional array for electron sources 30. The plurality of electron sources 320 may be planar as shown or follow any suitable surface (e.g., a curved surface). The configuration of the electron sources 30 within the array may be an suitable arrangement and may be based on design details of a specific application.

An optional plasma source 18 may also be included. In one embodiment, the optional plasma source 18 may be disposed at the top of the processing chamber 10. For example, appropriate openings may be provided in the plurality of electron sources 320. The optional plasma source 18 may also be disposed at a side of the processing chamber 10. The optional plasma source 18 may be a helical resonator source, inductively coupled plasma (ICP) source, capacitively coupled plasma (CCP) source, surface wave plasma (SWP) source, and the like.

Additional structures may also be included in the processing chamber 10. For example, an orifice plate may be included between the plurality of electron sources 320 and the substrate 16 effectively dividing the processing chamber 10 into an upper chamber and a lower chamber. Further, the plurality of electron sources 320 may be located in a vertically central region of the processing chamber 10 and plasma may be generated above the plurality of electron sources 320. In this configuration, the plurality of electron sources 320 may function as an orifice plate.

Figure 4:
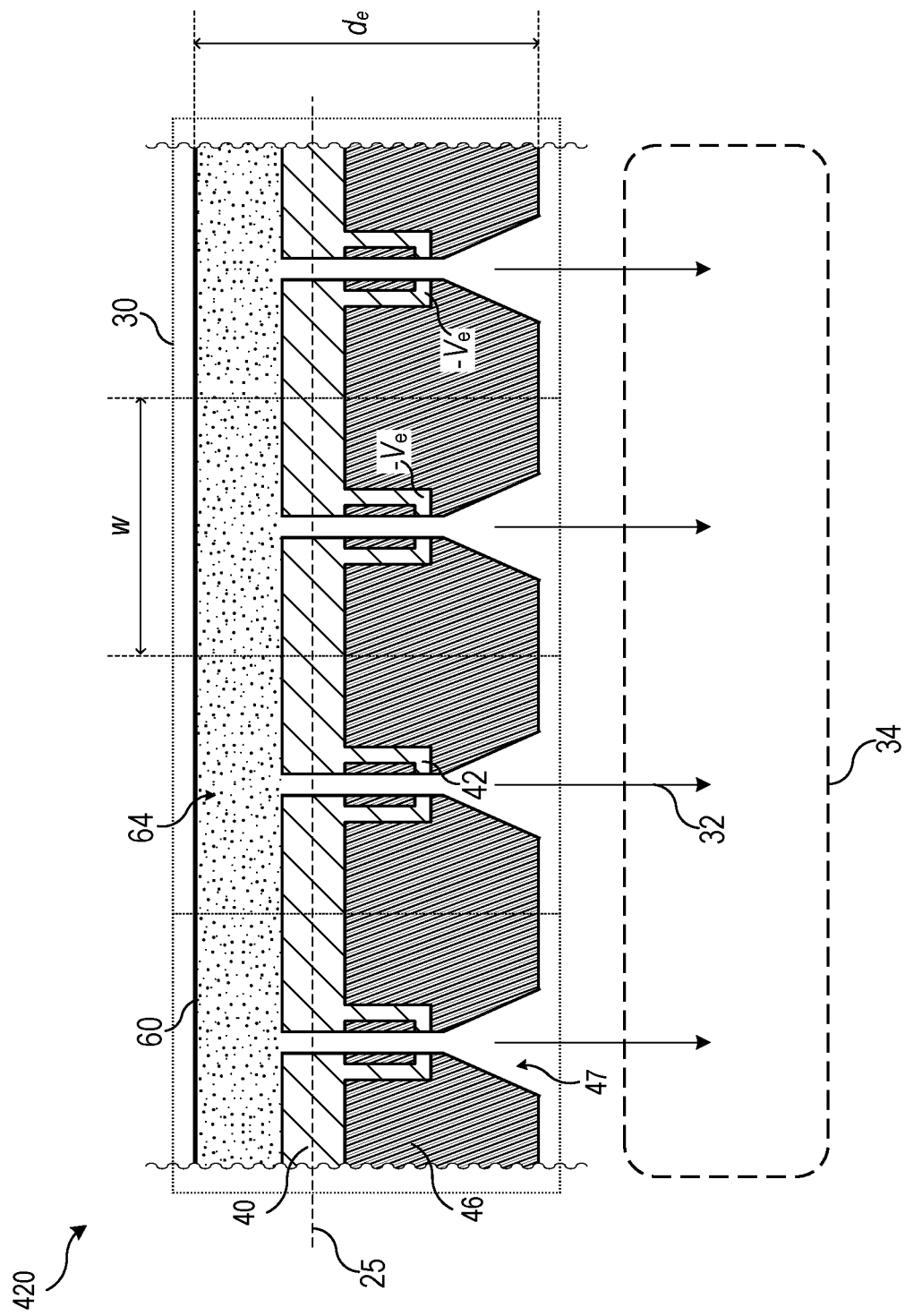
FIG. 4 illustrates a schematic cross-sectional view of an example plurality of electron sources including gas plenum, a transmission line, and resonant circuit elements in accordance with an embodiment of the invention.

FIG. 4 illustrates a schematic cross-sectional view of an example plurality of electron sources including a gas plenum chamber, a transmission line, and resonant circuit elements in accordance with an embodiment of the invention. The plurality of electron sources of FIG. 4 may be a specific implementation of other pluralities of electron sources as described herein, such as the plurality of electron sources 120 of FIG. 1, for example. Similarly labeled elements may be as previously described.

Referring to FIG. 4, a plurality of electron sources 420 includes electron sources 30 arranged in an array. Each of the electron sources 30 may include a resonant circuit 42 coupled to a transmission line 40. Each resonant circuit 42 may be coupled to a negative DC bias voltage $-V_e$ which may be the same or different between resonant circuits 42 (e.g., each resonant circuit 42 may be individually addressable). Each of the electron sources 30 may include an injector 47 which may be configured to shape a corresponding electron beam 32 directed toward the plasma 34. For example, the injector 47 may be any suitable shape and formed in a dielectric material 46. A gas plenum chamber 60 configured to confine a gas plenum 64 may supply gas each resonant circuit 42. The transmission line 40 and/or the gas plenum chamber 60 may be included along with the resonant circuits 42 and the injectors 47 in the dielectric material 46 which may be a ceramic material. Alternatively, one or both of the transmission line 40 and the gas plenum chamber 60 may be separate from the dielectric material 46.

The plurality of electron sources 420 may be disposed along a line 25 which may follow a surface of a chamber wall or may be any suitable shape. For example, if the plurality of electron sources 420 is implemented as a ring of electron sources attached to the chamber wall of a cylindrical processing chamber, the line 25 may be curved. Alternatively, if the plurality of electron sources 420 is implemented as a planar array of electron sources disposed above a substrate within a processing chamber, the line 25 may be straight. The line 25 may be any suitable shape. In other words, 1-dimensional and 2-dimensional arrays of electron sources may be implemented as a plurality of electron sources in any suitable shape as desired for a specific application.

Figure 5:
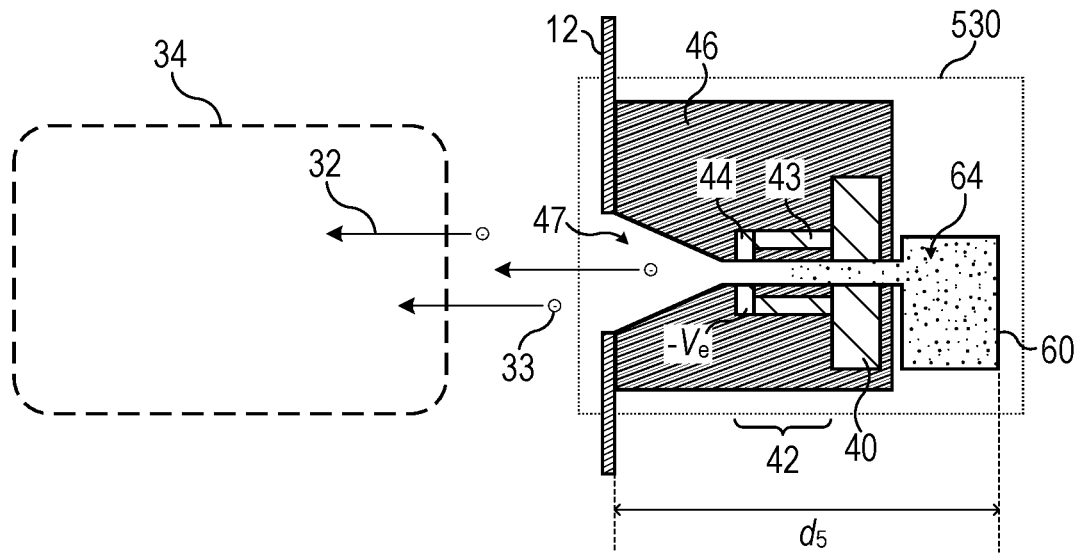
FIG. 5 illustrates a schematic cross-sectional view of an example electron source and associated plasma sustained by electrons from the electron source in accordance with an embodiment of the invention.

FIG. 5 illustrates a schematic cross-sectional view of an example electron source and associated plasma sustained by electrons from the electron source in accordance with an embodiment of the invention. The electron source of FIG. 5 may be a specific implementation of other electron sources as described herein, such as the electron source 30 of FIG. 1, for example. Similarly labeled elements may be as previously described.

Referring to FIG. 5, an electron source 530 includes a dielectric material 46 which may be attached to a chamber wall 12. A transmission line 40, capacitive circuit elements 43, and inductive circuit elements 44 may be included within the dielectric material 46. The capacitive circuit elements 43 and the inductive circuit elements 44 may be a resonant circuit 42 configured to receive AC power from the transmission line 40 and generate electrons 33. The electrons 33 may be accelerated through an injector 47 in the direction of a plasma 34 by a negative DC bias voltage $-V_e$ which is applied to the resonant circuit 42. A gas plenum chamber 60 may supply gas to the resonant circuit 42 from a gas plenum 64.

The gas plenum chamber 60 may be separate from the dielectric material 46 as shown or may be integrated into the dielectric material 46 similar to the transmission line 40. As previously described, the transmission line 40 is configured to couple power to a plurality of electron sources and continues into and/or out of the page (e.g., similar to the perspective of the plurality of electron sources 220 in FIG. 2B). The electron source 530 has a thickness $d_5$ which may be similar to the maximum thickness $d_e$ as previously described. The thickness $d_5$ may be influenced by a variety of factors including design of the injector 47, frequency of power coupled to the resonant circuit 42, type of dielectric material 46, specific fabrication process of the electron source 530, location and configuration of the gas plenum chamber 60, and others.

Figure 6:
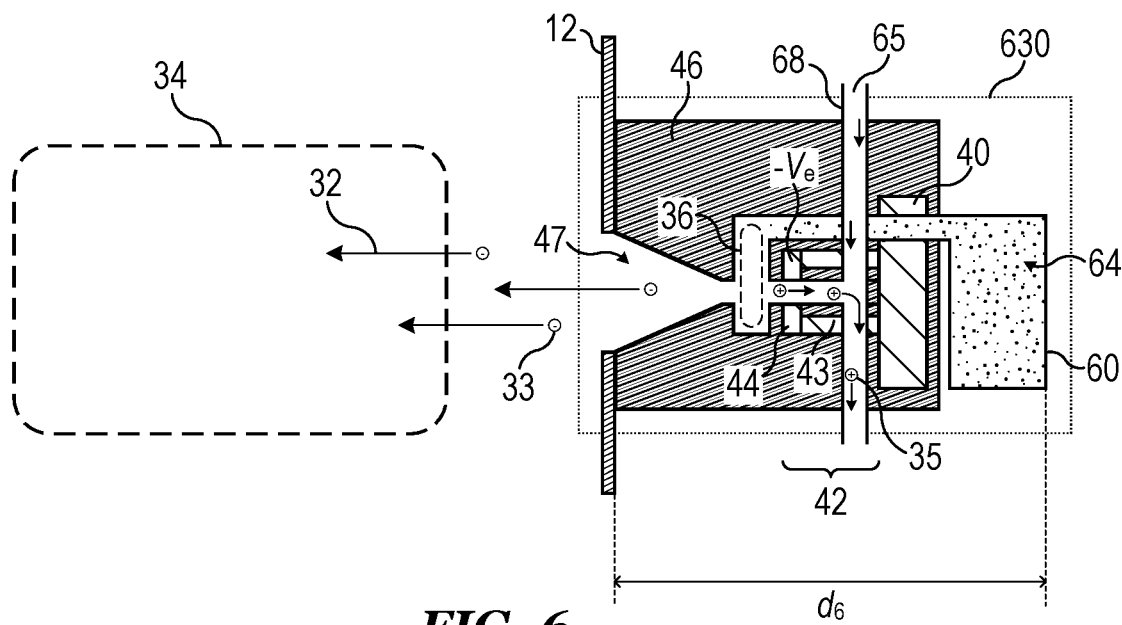
FIG. 6 illustrates a schematic cross-sectional view of an example electron source and associated plasma sustained by electrons from the electron source which includes an ion trap in accordance with an embodiment of the invention.

FIG. 6 illustrates a schematic cross-sectional view of an example electron source and associated plasma sustained by electrons from the electron source which includes an ion trap in accordance with an embodiment of the invention. The electron source of FIG. 6 may be a specific implementation of other electron sources as described herein, such as the electron source 30 of FIG. 1, for example. Similarly labeled elements may be as previously described.

Referring to FIG. 6, an electron source 630 is similar to the electron source 530 of FIG. 5, but also includes an ion trap 68 configured to carry ions 35 away from the plasma 34 (e.g., away from a plasma processing chamber) using a diversion gas 65 provided at a high rate of flow through the ion trap 68. The ions 35 are generated in an electron source plasma 36 which also generates the electrons 33. The ions 35 are accelerated away from the plasma 34 by the negative DC bias voltage $-V_e$ and subsequently diverted by the high flow of the diversion gas 65.

The thickness $d_6$ of the electron source 630 may be similar to the maximum thickness $d_e$ as previously described. Additionally, the thickness $d_6$ may be different from or similar to the thickness $d_5$ of the electron source 530. In other words, the incorporation of the ion trap 68 may or may not affect the thickness $d_6$ of the electron source 630. It should be noted however, that both the thickness $d_5$ of FIG. 5 and the thickness $d_6$ are small in comparison to the size of conventional electron sources. For example, irrespective of the configuration, the thickness $d_5$ of FIG. 5 and the thickness $d_6$ may be less than 2 cm.

Figure 7:
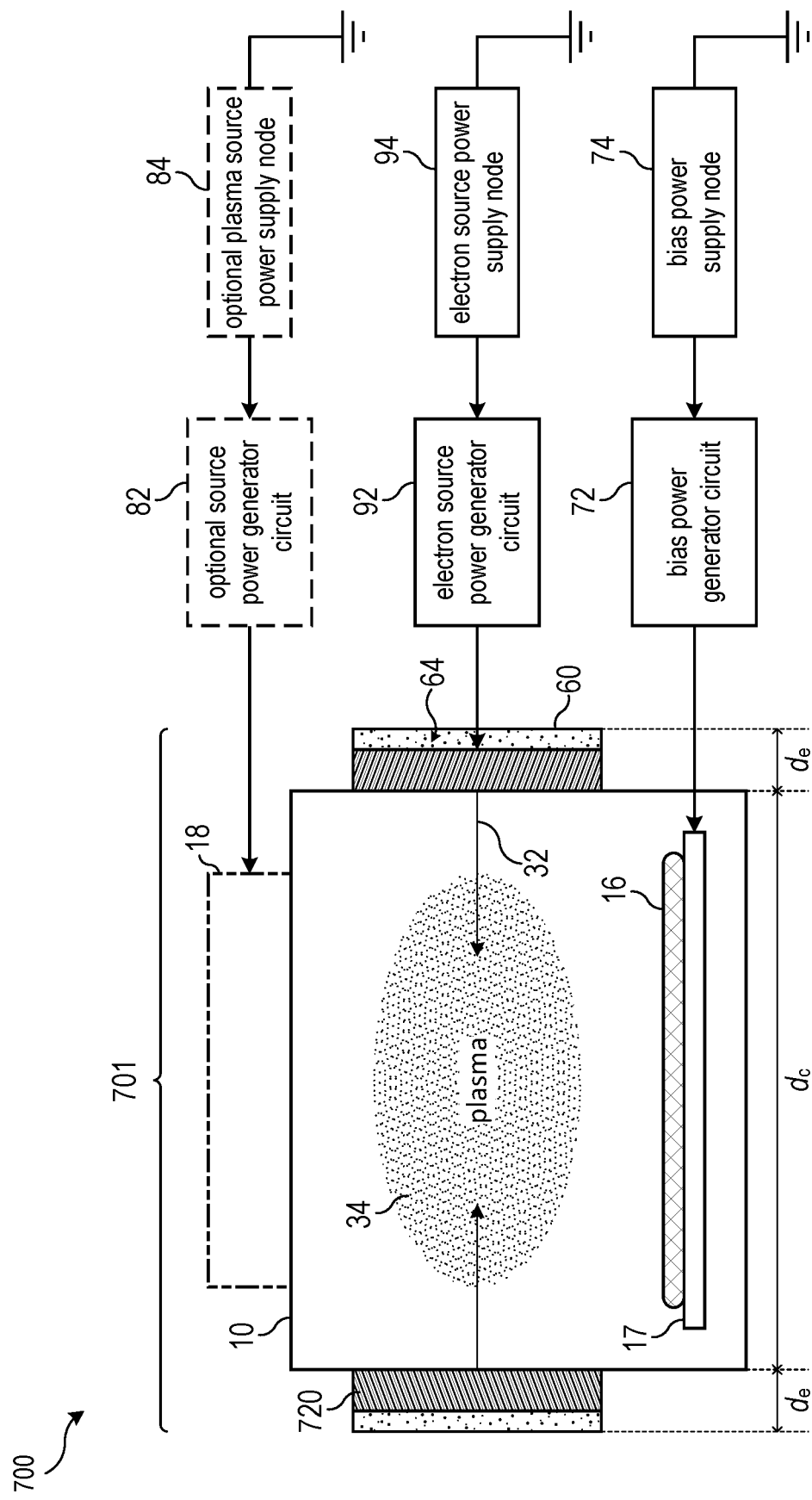
FIG. 7 illustrates a schematic block diagram of an example plasma processing system including in accordance with an embodiment of the invention.

FIG. 7 illustrates a schematic block diagram of an example plasma processing system including in accordance with an embodiment of the invention. The example plasma processing system of FIG. 7 may include embodiment plasma processing apparatuses as described herein, such as the plasma processing apparatus 100 of FIG. 1, for example. Similarly labeled elements may be as previously described Referring to FIG. 7, a plasma processing system 700 includes a plasma processing apparatus 701 which includes a plurality of electron sources 720 configured to supply electrons to a plasma 34 generated in a processing chamber 10. The plasma processing apparatus 701 may be a generalized example of other plasma processing apparatuses described herein, such as the plasma processing apparatus 100, for example. The plurality of electron sources 720 is configured to receive power from an electron source power supply node 94 through an electron source power generator circuit 92. For example, the electrons may be supplied to the plasma 34 in electron beams 32.

The plasma processing system 700 further includes a substrate 16 disposed in a processing chamber 10. The substrate 16 may be supported by a bias power coupling element 17 which may be a substrate holder, for example. The bias power coupling element 17 may be configured to receive power from a bias power supply node 74 through a bias power generator circuit 72. An optional plasma source 18 may also be included which may generate the plasma 34, aid in igniting or sustaining the plasma 34, or generate a separate plasma. The optional plasma source 18 may be configured to receive power from an optional plasma source power supply node 84 through an optional source power generator circuit 82.

Figure 8:
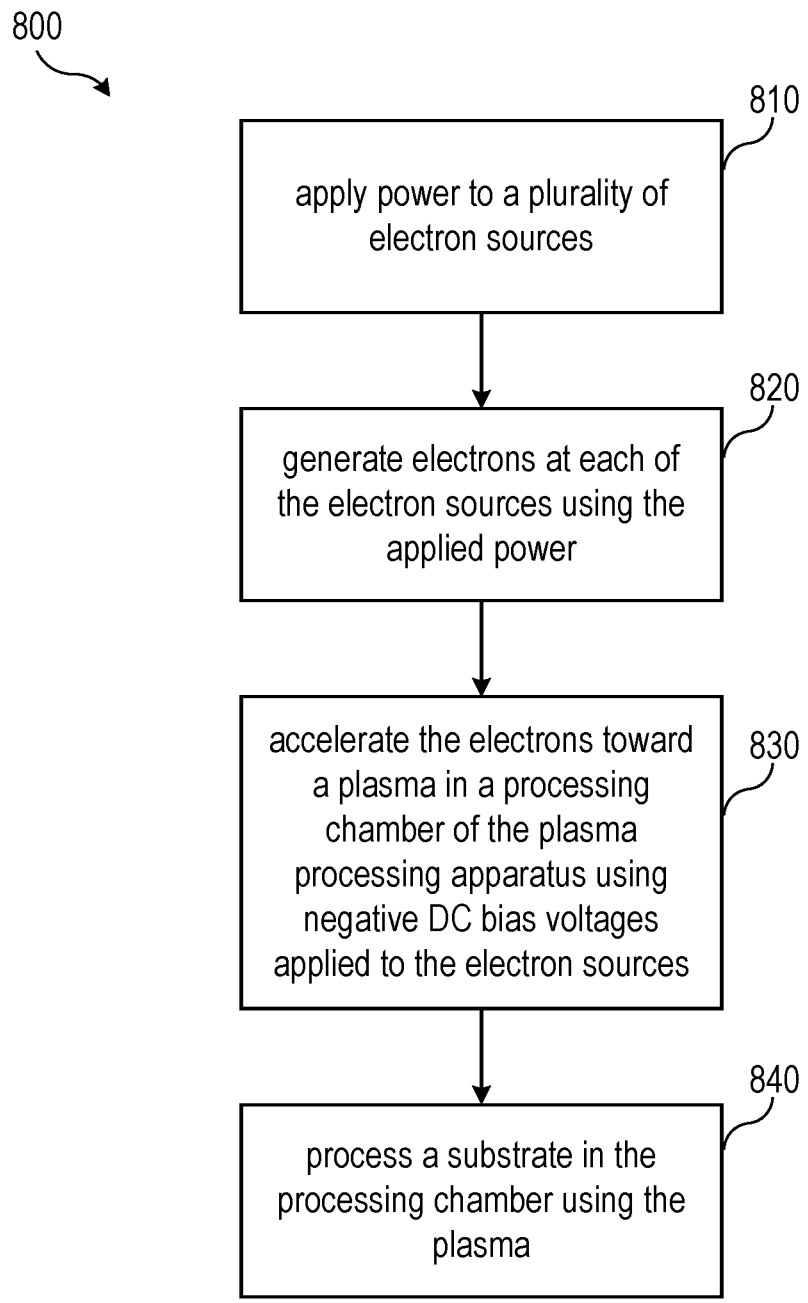
FIG. 8 illustrates an example method of operating a plasma processing apparatus in accordance with an embodiment of the invention.

FIG. 8 illustrates an example method of operating a plasma processing apparatus in accordance with an embodiment of the invention. The method of FIG. 8 may be used to operate embodiment plasma processing apparatuses as described herein, such as the plasma processing apparatus 100 of FIG. 1, for example.

Step 810 of a method 800 of operating a plasma processing apparatus includes applying power to a plurality of electron sources. The plurality of electron sources may be an array of electron sources, such as a 1-dimensional (e.g. linear) array or a 2-dimensional array. In one embodiment, the plurality of electron sources is a ring of electron sources.

Step 820 includes generating electrons at each of the electron sources using the applied power. In one embodiment the electrons of each of the electron sources are generated by corresponding resonant structures of the electron sources. For example, an electron source plasma may be generated at each of the electron sources.

Step 830 includes accelerating the electrons toward a plasma in a processing chamber of the plasma processing apparatus using negative DC bias voltages applied to the electron sources. Step 840 includes processing a substrate in the processing chamber using the plasma.

Example embodiments of the invention are summarized here. Other embodiments can also be understood from the entirety of the specification as well as the claims filed herein.

Example 1

A plasma processing apparatus including: a processing chamber; a substrate disposed in the processing chamber; and a plurality of electron sources configured to supply electrons to a plasma generated in the processing chamber, where each of the plurality of electron sources includes a first side facing the plasma in the processing chamber, and a resonant structure disposed at the first side configured to be held at a negative direct current (DC) bias voltage.

Example 2

The plasma processing apparatus of example 1, where the plurality of electron sources are disposed in an array attached to a chamber wall of the processing chamber, the chamber wall being substantially perpendicular to a major surface of the substrate.

Example 3

The plasma processing apparatus of example 2, where the array extends completely around the processing chamber.

Example 4

The plasma processing apparatus of example 1, where the plurality of electron sources are disposed in an array above the substrate.

Example 5

The plasma processing apparatus of one of examples 1 to 4, where each resonant structure includes a resonant antenna configured to generate a respective electron source plasma that supplies electrons accelerated toward the plasma by the respective negative DC bias voltage.

Example 6

The plasma processing apparatus of one of examples 1 to 5, further including: an ion trap disposed at the plurality of electron sources; where ions generated by the plurality of electron sources are accelerated away from the plasma by the respective negative DC bias voltages; and where the ion trap is configured to carry the ions away from the processing chamber.

Example 7

A plasma processing apparatus including: a processing chamber; a substrate disposed in the processing chamber; and an array of resonant antennas attached to the processing chamber, the array of resonant antennas being configured to receive radio frequency (RF) power and generate a plurality of electron beams directed toward a plasma in the processing chamber.

Example 8

The plasma processing apparatus of example 7, where each of the electron beams is directed parallel to a major surface of the substrate.

Example 9

The plasma processing apparatus of example 8, where each of the electron beams is further directed toward a center axis of the processing chamber normal to the major surface.

Example 10

The plasma processing apparatus of example 7, where each of the plurality of electron beams is directed perpendicular to a major surface of the substrate.

Example 11

The plasma processing apparatus of one of examples 7 to 10, where the array of resonant antennas is disposed in a monolithic body of dielectric material.

Example 12

The plasma processing apparatus of one of examples 7 to 11, further including: an ion trap disposed at the array of resonant antennas, where ions generated by the array of resonant antennas are carried away from the processing chamber by the ion trap.

Example 13

The plasma processing apparatus of one of examples 7 to 12, further including: a plurality of injectors disposed adjacent to corresponding resonant antennas of the array of resonant antennas; and where generated electrons associated with each resonant antenna pass through a corresponding injector of the plurality of injectors.

Example 14

A plasma processing apparatus including: a processing chamber including a chamber wall and a maximum width; a substrate disposed in the processing chamber, the maximum width being measured parallel to a major surface of the substrate; a monolithic body of dielectric material attached to the chamber wall; a plurality of electron sources disposed in the monolithic body of dielectric material, each of the plurality of electron sources being configured to supply electrons to a plasma generated in the processing chamber; a gas plenum chamber coupled to the plurality of electron sources, the gas plenum chamber being configured to supply gas to the plurality of electron sources; where the plurality of electron sources together with the gas plenum chamber includes a maximum thickness measured from the chamber wall; and where a ratio of the maximum width to the maximum thickness is greater than 100.

Example 15

The plasma processing apparatus of example 14, where the ratio is greater than 250.

Example 16

The plasma processing apparatus of one of examples 14 and 15, where: the plurality of electron sources are configured to receive microwave power; and each of the plurality of electron sources includes a width measured parallel to the major surface of the substrate along an outer surface of the chamber wall, the width being less than 1 cm.

Example 17

The plasma processing apparatus of one of examples 14 and 15, where: the plurality of electron sources are configured to receive very high frequency (VHF) power; and each of the plurality of electron sources includes a width measured parallel to the major surface of the substrate along an outer surface of the chamber wall, the width being less than 20 cm.

Example 18

The plasma processing apparatus of one of examples 14 to 17, where the monolithic body of dielectric material surrounds the processing chamber.

Example 19

The plasma processing apparatus of one of examples 14 to 18, further including: an additional monolithic body of dielectric material attached to the chamber wall; and an additional plurality of electron sources disposed in the additional monolithic body of dielectric material, each of the additional plurality of electron sources being configured to supply additional electrons to the plasma generated in the processing chamber.

Example 20

The plasma processing apparatus of one of examples 14 to 19, where the dielectric material is a ceramic material.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, one or more of the embodiments of FIGS. 1A-1B, 2A-2B, and 3A-3B may be combined in further embodiments. Similarly, embodiments described with respect to FIGS. 1A-1B through FIG. 5 may be combined with FIGS. 7 and 8. It is therefore intended that the appended claims encompass any such modifications or embodiments.

What is claimed is:

1. A plasma processing apparatus comprising:
   a processing chamber;
   a substrate disposed in the processing chamber; and
   a plurality of electron sources configured to supply electrons to a plasma generated in the processing chamber, wherein each of the plurality of electron sources comprises
      a first side facing the plasma in the processing chamber, and
      a resonant structure disposed at the first side and configured to be held at a negative direct current (DC) bias voltage, and
   wherein each resonant structure comprises a resonant antenna configured to generate a respective electron source plasma that supplies electrons accelerated toward the plasma by the respective negative DC bias voltage.

2. The plasma processing apparatus of claim 1, wherein the vertically arrayed electron sources extend completely around the processing chamber.

3. The plasma processing apparatus of claim 1, further comprising:
   an ion trap disposed at the plurality of electron sources;
   wherein ions generated by the plurality of electron sources are accelerated away from the plasma by the respective negative DC bias voltages; and
   wherein the ion trap is configured to carry the ions away from the processing chamber.

4. The plasma processing apparatus of claim 1, wherein the plurality of electron sources are disposed in an array attached to a chamber wall of the processing chamber, the chamber wall being substantially perpendicular to a major surface of the substrate.

5. The plasma processing apparatus of claim 1, wherein the plurality of electron sources are disposed in an array above the substrate.

6. A plasma processing apparatus comprising:
a processing chamber;
a substrate disposed in the processing chamber; and
a vertical array of resonant antennas attached to a side chamber wall of the processing chamber, the side chamber wall being substantially perpendicular to a major surface of the substrate, the array of resonant antennas being configured to receive radio frequency (RF) power and generate a plurality of electron beams directed toward a plasma in the processing chamber.

7. The plasma processing apparatus of claim 6, wherein each of the electron beams is directed parallel to a major surface of the substrate.

8. The plasma processing apparatus of claim 7, wherein each of the electron beams is further directed toward a center axis of the processing chamber normal to the major surface.

9. The plasma processing apparatus of claim 6, wherein each of the plurality of electron beams is directed perpendicular to a major surface of the substrate.

10. The plasma processing apparatus of claim 6, wherein the array of resonant antennas is disposed in a monolithic body of dielectric material.

11. The plasma processing apparatus of claim 6, further comprising:
an ion trap disposed at the array of resonant antennas, wherein ions generated by the array of resonant antennas are carried away from the processing chamber by the ion trap.

12. The plasma processing apparatus of claim 6, further comprising:
a plurality of injectors disposed adjacent to corresponding resonant antennas of the array of resonant antennas; and
wherein generated electrons associated with each resonant antenna pass through a corresponding injector of the plurality of injectors.

13. A plasma processing apparatus comprising:
a processing chamber comprising a chamber wall and a maximum width;
a substrate disposed in the processing chamber, the maximum width being measured parallel to a major surface of the substrate;
a monolithic body of dielectric material attached to the chamber wall;
a plurality of electron sources disposed in the monolithic body of dielectric material, each of the plurality of electron sources being configured to supply electrons to a plasma generated in the processing chamber;
a gas plenum chamber coupled to the plurality of electron sources, the gas plenum chamber being configured to supply gas to the plurality of electron sources;
wherein the plurality of electron sources together with the gas plenum chamber comprises a maximum thickness measured from the chamber wall; and
wherein a ratio of the maximum width to the maximum thickness is greater than 100.

14. The plasma processing apparatus of claim 13, wherein the ratio is greater than 250.

15. The plasma processing apparatus of claim 13, wherein:
the plurality of electron sources are configured to receive microwave power; and
each of the plurality of electron sources comprises a width measured parallel to the major surface of the substrate along an outer surface of the chamber wall, the width being less than 1 cm.

16. The plasma processing apparatus of claim 13, wherein:
the plurality of electron sources are configured to receive very high frequency (VHF) power; and
each of the plurality of electron sources comprises a width measured parallel to the major surface of the substrate along an outer surface of the chamber wall, the width being less than 20 cm.

17. The plasma processing apparatus of claim 13, wherein the monolithic body of dielectric material surrounds the processing chamber.

18. The plasma processing apparatus of claim 13, further comprising:
an additional monolithic body of dielectric material attached to the chamber wall; and
an additional plurality of electron sources disposed in the additional monolithic body of dielectric material, each of the additional plurality of electron sources being configured to supply additional electrons to the plasma generated in the processing chamber.

19. The plasma processing apparatus of claim 13, wherein the dielectric material is a ceramic material.

* * * * *